United States Patent
Ahn et al.

(10) Patent No.: US 7,049,192 B2
(45) Date of Patent: May 23, 2006

(54) LANTHANIDE OXIDE / HAFNIUM OXIDE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/602,315

(22) Filed: Jun. 24, 2003

(65) Prior Publication Data

US 2004/0262700 A1 Dec. 30, 2004

(51) Int. Cl.
*H01L 21/8242* (2006.01)

(52) U.S. Cl. .................. 438/240; 438/591; 438/778; 438/785

(58) Field of Classification Search ......... 438/238–240, 438/244, 253, 255, 260, 398, 591, 773–775, 438/778, 784, 785
See application file for complete search history.

(56) References Cited

U.S. PATENT DOCUMENTS

| | | | |
|---|---|---|---|
| 3,357,961 | A | 12/1967 | Makowski et al. |
| 4,413,022 | A | 11/1983 | Suntola et al. |
| 5,049,516 | A | 9/1991 | Arima |
| 5,302,461 | A | 4/1994 | Anthony |
| 5,426,603 | A | 6/1995 | Nakamura et al. |
| 5,572,052 | A | 11/1996 | Kashihara et al. |

(Continued)

FOREIGN PATENT DOCUMENTS

| | | |
|---|---|---|
| EP | 1124262 | 8/2001 |
| JP | 2001-332546 | 11/2001 |

OTHER PUBLICATIONS

Ohmi et al., "Rare Earth Metal Oxides for High—K gate insulator", Proceedings—Electrochemical Society, vol. 1, p 376–387 (2002).*

Aarik, Jaan , et al., "Influence of substrate temperature on atomic layer growth and properties of HfO/sub 2/ thin films", *Thin Solid Films, 340(1–2),* (1999), 110–116.

Aarik, Jaan , et al., "Phase transformations in hafnium dioxide thin films grown by atomic layer deposition at high temperatures", *Applied Surface Science, 173(1–2),* (Mar. 2001), 15–21.

Aarik, Jaan , et al., "Texture Development in nanocrystalline hafnium dioxide thin films grown by atomic layer deposition", *Journal of Crystal Growth, 220,* (2000), 105–113.

Bunshah, Rointan F., et al., "Deposition Technologies for Films and Coatings: Developments and Applications", *Park Ridge, N.J., U.S.A. : Noyes Publications,* (1982), 102–103.

(Continued)

*Primary Examiner*—Asok Kumar Sarkar
(74) *Attorney, Agent, or Firm*—Schwegman, Lundberg, Woessner & Kluth, P.A.

(57) ABSTRACT

Dielectric layers containing a chemical vapor deposited hafnium oxide and an electron beam evaporated lanthanide oxide and a method of fabricating such a dielectric layer produce a reliable dielectric layer having an equivalent oxide thickness thinner than attainable using $SiO_2$. Forming a layer of hafnium oxide by chemical vapor deposition and forming a layer of a lanthanide oxide by electron beam evaporation, where the layer of hafnium oxide is adjacent and in contact with the layer of lanthanide, provides a dielectric layer with a relatively high dielectric constant as compared with silicon dioxide. Forming the layer of hafnium oxide by chemical vapor deposition using precursors that do not contain carbon permits the formation of the dielectric layer without carbon contamination. The dielectric can be formed as a nanolaminate of hafnium oxide and a lanthanide oxide.

45 Claims, 6 Drawing Sheets

U.S. PATENT DOCUMENTS

| | | | |
|---|---|---|---|
| 6,010,969 A | 1/2000 | Vaartstra | |
| 6,020,024 A | 2/2000 | Maiti et al. | |
| 6,207,589 B1 | 3/2001 | Ma et al. | |
| 6,217,645 B1 | 4/2001 | Vaartstra | |
| 6,225,237 B1 | 5/2001 | Vaartstra | |
| 6,273,951 B1 | 8/2001 | Vaartstra | |
| 6,297,539 B1 | 10/2001 | Ma et al. | |
| 6,300,203 B1 | 10/2001 | Buynoski et al. | |
| 6,313,035 B1 | 11/2001 | Sandhu et al. | |
| 6,348,386 B1 | 2/2002 | Gilmer | |
| 6,368,398 B1 | 4/2002 | Vaartstra | |
| 6,420,279 B1 | 7/2002 | Ono et al. | |
| 6,451,641 B1 | 9/2002 | Halliyal et al. | |
| 6,451,695 B1 | 9/2002 | Sneh | |
| 6,455,717 B1 | 9/2002 | Vaartstra | |
| 6,458,701 B1 | 10/2002 | Chae et al. | |
| 6,465,334 B1 | 10/2002 | Buynoski et al. | |
| 6,482,740 B1 | 11/2002 | Soininen et al. | |
| 6,495,436 B1 | 12/2002 | Ahn et al. | |
| 6,509,280 B1 | 1/2003 | Choi | |
| 6,514,828 B1 | 2/2003 | Ahn et al. | |
| 6,521,911 B1 | 2/2003 | Parsons et al. | |
| 6,527,866 B1 | 3/2003 | Matijasevic et al. | |
| 6,531,354 B1 | 3/2003 | Maria et al. | |
| 6,534,420 B1 | 3/2003 | Ahn et al. | |
| 6,537,613 B1 | 3/2003 | Senzaki et al. | |
| 6,541,079 B1 | 4/2003 | Bojarczuk, Jr. et al. | |
| 6,544,875 B1 | 4/2003 | Wilk | |
| 6,586,349 B1 | 7/2003 | Jeon et al. | |
| 6,608,378 B1 | 8/2003 | Forbes et al. | |
| 6,613,656 B1 | 9/2003 | Li | |
| 6,627,503 B1 | 9/2003 | Ma et al. | |
| 6,632,279 B1 | 10/2003 | Ritala et al. | |
| 6,639,267 B1 | 10/2003 | Eldridge | |
| 6,645,882 B1 | 11/2003 | Halliyal et al. | |
| 6,661,058 B1 | 12/2003 | Ahn et al. | |
| 6,674,138 B1 | 1/2004 | Halliyal et al. | |
| 6,682,602 B1 | 1/2004 | Vaartstra | |
| 6,683,011 B1 * | 1/2004 | Smith et al. | 438/785 |
| 6,699,745 B1 * | 3/2004 | Banerjee et al. | 438/238 |
| 6,699,747 B1 | 3/2004 | Ruff et al. | |
| 6,713,846 B1 | 3/2004 | Senzaki | |
| 6,730,575 B1 | 5/2004 | Eldridge | |
| 6,750,066 B1 | 6/2004 | Cheung et al. | |
| 6,762,114 B1 | 7/2004 | Chambers | |
| 6,770,536 B1 | 8/2004 | Wilk et al. | |
| 6,787,413 B1 | 9/2004 | Ahn | |
| 6,790,791 B1 | 9/2004 | Ahn et al. | |
| 6,800,567 B1 | 10/2004 | Cho | |
| 6,812,100 B1 | 11/2004 | Ahn et al. | |
| 6,831,315 B1 | 12/2004 | Raaijmakers et al. | |
| 6,884,739 B1 | 4/2005 | Ahn et al. | |
| 6,893,984 B1 | 5/2005 | Ahn et al. | |
| 6,900,122 B1 | 5/2005 | Ahn et al. | |
| 6,921,702 B1 | 7/2005 | Ahn et al. | |
| 2001/0009695 A1 | 7/2001 | Saanila et al. | |
| 2001/0042505 A1 | 11/2001 | Vaartstra | |
| 2001/0051442 A1 | 12/2001 | Katsir | |
| 2002/0001971 A1 | 1/2002 | Cho | |
| 2002/0086507 A1 | 7/2002 | Park et al. | |
| 2002/0086555 A1 | 7/2002 | Ahn et al. | |
| 2002/0089023 A1 | 7/2002 | Yu et al. | |
| 2002/0111001 A1 | 8/2002 | Ahn | |
| 2002/0122885 A1 | 9/2002 | Ahn | |
| 2002/0155688 A1 | 10/2002 | Ahn et al. | |
| 2002/0155689 A1 | 10/2002 | Ahn et al. | |
| 2002/0192974 A1 | 12/2002 | Ahn et al. | |
| 2002/0192975 A1 | 12/2002 | Ahn | |
| 2002/0192979 A1 | 12/2002 | Ahn | |
| 2003/0001241 A1 | 1/2003 | Chakrabarti et al. | |
| 2003/0003702 A1 | 1/2003 | Ahn | |
| 2003/0017717 A1 | 1/2003 | Ahn | |
| 2003/0042526 A1 | 3/2003 | Weimer | |
| 2003/0043637 A1 | 3/2003 | Forbes et al. | |
| 2003/0045060 A1 | 3/2003 | Ahn | |
| 2003/0045078 A1 | 3/2003 | Ahn et al. | |
| 2003/0048666 A1 | 3/2003 | Eldridge et al. | |
| 2003/0049942 A1 | 3/2003 | Haukka et al. | |
| 2003/0052358 A1 | 3/2003 | Weimer | |
| 2003/0059535 A1 | 3/2003 | Luo et al. | |
| 2003/0119246 A1 | 6/2003 | Ahn | |
| 2003/0119291 A1 | 6/2003 | Ahn et al. | |
| 2003/0119313 A1 | 6/2003 | Yang et al. | |
| 2003/0132491 A1 | 7/2003 | Ahn | |
| 2003/0175411 A1 | 9/2003 | Kodas et al. | |
| 2003/0207032 A1 | 11/2003 | Ahn et al. | |
| 2003/0207540 A1 | 11/2003 | Ahn et al. | |
| 2003/0222300 A1 | 12/2003 | Basceri et al. | |
| 2003/0227033 A1 | 12/2003 | Ahn et al. | |
| 2003/0228747 A1 | 12/2003 | Ahn et al. | |
| 2003/0232511 A1 | 12/2003 | Metzner et al. | |
| 2004/0023461 A1 | 2/2004 | Ahn et al. | |
| 2004/0033681 A1 | 2/2004 | Ahn et al. | |
| 2004/0033701 A1 | 2/2004 | Ahn et al. | |
| 2004/0038554 A1 | 2/2004 | Ahn | |
| 2004/0043541 A1 | 3/2004 | Ahn | |
| 2004/0043557 A1 * | 3/2004 | Haukka et al. | 438/240 |
| 2004/0043569 A1 | 3/2004 | Ahn | |
| 2004/0043635 A1 | 3/2004 | Vaartstra | |
| 2004/0087124 A1 | 5/2004 | Kubota et al. | |
| 2004/0099889 A1 | 5/2004 | Frank et al. | |
| 2004/0110348 A1 | 6/2004 | Ahn et al. | |
| 2004/0110391 A1 | 6/2004 | Ahn et al. | |
| 2004/0144980 A1 | 7/2004 | Ahn et al. | |
| 2004/0134365 A1 | 8/2004 | Ahn et al. | |
| 2004/0164357 A1 | 8/2004 | Ahn et al. | |
| 2004/0164365 A1 | 8/2004 | Ahn et al. | |
| 2004/0175882 A1 | 9/2004 | Ahn et al. | |
| 2004/0183108 A1 | 9/2004 | Ahn | |
| 2004/0185654 A1 | 9/2004 | Ahn | |
| 2004/0214399 A1 | 10/2004 | Ahn et al. | |
| 2004/0264236 A1 | 12/2004 | Chae et al. | |
| 2005/0009370 A1 | 1/2005 | Ahn | |
| 2005/0020017 A1 | 1/2005 | Ahn et al. | |
| 2005/0026349 A1 | 2/2005 | Forbes et al. | |
| 2005/0037563 A1 | 2/2005 | Ahn | |
| 2005/0054165 A1 | 3/2005 | Ahn et al. | |
| 2005/0077519 A1 | 4/2005 | Ahn et al. | |
| 2005/0124174 A1 | 6/2005 | Ahn et al. | |

OTHER PUBLICATIONS

Callegari, A., et al., "Physical and electrical characterization of Hafnium oxide and Hafnium silicate sputtered films", *Journal of Applied Physics, 90(12)*, (Dec. 15, 2001), 6466–75.

Cheng, Baohong, et al., "The Impact of High–k Gate Dielectrics and Metal Gate Electrodes on Sub–100nm MOSFET's", *IEEE Transactions on Electron Devices, 46(7)*, (Jul. 1999), 1537–1544.

Clark, P, "IMEC Highlights Hafnium, Metal Gates for High–k Integration", *Semiconductor Business News*, at Silicon Strategies.com, (Oct. 11, 2002), 2 pages.

Colombo, D., et al., "Anhydrous Metal Nitrates as Volatile Single Source Precursors for the CVD of Metal Oxide Films", *Communications, Department of EE, U of M, Mpls. MN*, (Jul. 7, 1998), 3 pages.

Conley Jr., J F., et al., "Atomic Layer Deposition of Hafnium Oxide Using Anhydrous Hafnium Nitrate", *Electrochemical and Solid State Letters, 5(5)*, (2002), C57–C59.

Forsgren, Katarina, "Atomic Layer Deposition of HfO2 using hafnium iodide", *Conference held in Monterey, California*, (May 2001), 1 page.

Forsgren, Katarina, "CVD and ALD of Group IV– and V–Oxides for Dielectric Applications", *Comprehensive Summaries of Uppsala Dissertation from the Faculty of Science and Technology, 665*, (2001).

Gusev, E P., et al., "Ultrathin High–K Dielectrics Grown by Atomic Layer Deposition: A Comparative Study of ZrO2, HfO2, Y2O3 and Al2O3", *Electrochemical Society Proceedings vol. 2001–9*, (2001), 189–195.

Hubbard, K. J., "Thermodynamic stability of binary oxides in contact with silicon", *Journal of Materials Research, 11(11)*, (Nov. 1996), 2757–2776.

Kawai, Y, et al., "Ultra–low–temperature growth of high–integrity gate oxide films by low–energy Ion–assisted oxidation", *Applied Physics Letters, 64(17)*, (Apr. 1994), 2223–2225.

Kwo, J., et al., "High $\epsilon$ gate dielectrics Gd2O3 and Y2O3 for silicon", *Applied Physics Letters, 77(1)*, (Jul. 3, 2000), 130–132.

Kwo, J., "Properties of high k gate dielectrics Gd2O3 and Y2O3 for Si", *Journal of Applied Physics, 89(7)*, (2001), 3920–3927.

Lee, S. J., et al., "Hafnium oxide gate stack prepared by in situ rapid thermal chemical vapor deposition process for advanced gate dielectrics", *Journal of Applied Physics, 92 (5)*, (Sep. 1, 2002), 2807–09.

Lee, Byoung H., et al., "Ultrathin Hafnium Oxide with Low Leakage and excellent Reliability for Alternative Gate Dielectric Application", *IEEE Technical Digest of International Electron Devices Meeting 1999*, (1999), 133–136.

Nieminen, Minna, et al., "Formation and stability of lanthanum oxide thin films deposited from B–diketonate precursor", *Applied Surface Science, 174(2)*, (Apr. 16, 2001), 155–165.

Ohring, Milton, "The Materials Science of Thin Films", *Boston : Academic Press*, (1992), 118, 121, 125.

Osten, H. J., et al., "High–k gate dielectrics with ultra–low leakage current based on praseodymium oxide", *International Electroc Devices Meeting 2000, Technical Digest. IEDM*, (2000), 653–656.

Park, Byoung K., et al., "Interfacial reaction between chemically vapor–deposited HfO2 thin films and a HF–cleaned Si substrate during film growth and postannealing", *Applied Physics Letters, 80(13)*, (Apr. 1, 2002), 2368–70.

Ritala, Mikko, "Atomic Layer Epitaxy Growth of Titanium, Zirconium and Hafnium Dioxide Thin Films", *Annales Academiae Scientiarum Fennicae*, (1994), 24–25.

Smith, Ryan C., et al., "Chemical Vapour Deposition of the Oxides of Titanium, Zirconium and Hafnium for Use as High–k Materials in Microelectronic Devices. A Carbon–free Precursor for the Synthesis of Hafnium Dioxide", *Advanced Materials for Optics and Electronics, 10(3–5)*, (Jun. 29, 2000), 105–14.

Wilk, G. D., "High–K gate dielectrics: Current status and materials properties considerations", *Journal of Applied Physics, 89(10)*, (May 2001), 5243–5275.

Wolf, Stanley, et al., "Future Trends in Sputter Deposition Processes", *In: Silicon Processing of the VLSI Era, vol. 1*, Lattice Press, (1986), 374–380.

Wolf, Stanley, et al., "Silicon Processing for the VLSI Era—Vol. I: Process Technology", *Second Edition, Lattice Press*, Sunset Beach, California, (2000), 443.

Yamamoto, K., et al., "Effect of Hf metal predeposition on the properties of sputtered HfO1/Hf stacked gate dielectrics", *Applied Physics Letters, 81(11)*, (Sep. 9, 2002), 2053–5.

Zhang, H., "Atomic Layer Deposition of High Dielectric Constant Nanolaminates", *Journal of the Electrochemical Society, 148(4)*, (Apr. 2001), F63–F66.

Zhu, W, et al., "HfO2 and HfAlO for CMOS: Thermal Stability and Current Transport", *IEEE International Electron Device Meeting 2001*, (2001), 463–468.

Bendoraitis, J G., et al., "Optical energy gaps in the monoclinic oxides of hafnium and zirconium and their solid solutions", *Journal of Physical Chemistry, 69(10)*, (1965), 3666–3667.

Guillaumot, B, et al., "75 nm damascene metal gate and high–k integration for advanced CMOS devices", *Technical Digest of International Electron Devices Meeting, 2002*, (2002), 355–358.

Gutowski, M J., "Thermodynamic stability of high–K dielectric metal oxides ZrO/sub 2/ and HfO/sub 2/ in contact with Si and SiO/sub 2/", *Applied Physics Letters, 80(11)*, (Mar. 18, 2002), 1897–1899.

Jeon, Sanghun, et al., "Excellent electrical characteristics of lanthanide (Pr, Nd, Sm, Gd, and Dy) oxide and lanthanide–doped oxide for MOS gate dielectric applications", *Electron Devices Meeting, 2001. IEDM Technical Digest. International*, (2001), 471–474.

Jung, H S., et al., "Improved current performance of CMOSFETs with nitrogen incorporated HfO/sub 2/–Al/sub 2/O/sub 3/ laminate gate dielectric", *Technical Digest of International Electron Devices Meeting 2002*, (2002), 853–856.

Kang, L, et al., "MOSFET devices with polysilicon on single–layer HfO/sub 2/ high–K dielectrics", *International Electron Devices Meeting 2000. Technical Digest. IEDM*, (2000), 35–8.

Kim, Y W., et al., "50nm gate length logic technology with 9–layer Cu interconnects of 90nm node SoC applications", *Technology Digest of International Electron Devices Meeting 2002*, (2002), 69–72.

Kukli, K, et al., "Comparison of hafnium oxide films grown by atomic layer deposition from iodide and chloride precursors", *Thin Solid Films, 416*, (2002), 72–79.

Kukli, Kaupo, et al., "Influence of thickness and growth temperature on the properties of zirconium oxide films growth by atomic layer deposition on silicon", *Thin Solid Films, 410(1–2)*, (2002), 53–60.

Kukli, K J., et al., "Properties of hafnium oxide films grown by atomic layer deposition from hafnium tetraiodide and oxygen", *Journal of Applied Physics, 92(10)*, (Nov. 15, 2002), 5698–5703.

Lee, Byoung H., et al., "Characteristics of TaN gate MOSFET with ultrathin hafnium oxide (8 A–12 A)", *Electron Devices Meeting, 2000. IEDM Technical Digest. International*, (2000), 39–42.

Lee, Byoung H., et al., Technical Digest of International Electron Devices Meetings 2002, 221–224.

Lee, S J., et al., "High quality ultra thin CVD HfO2 gate stack with poly–Si gate electrode", *Electron Devices Meeting, 2000. IEDM Technical Digest, International*, (2000), 31–34.

Oh, C. B., et al., "Manufacturable embedded CMOS 6T–SRAM technology with high–k gate dielectric device for sytstem–on–chip applications", *Technical Digest of International Electron Devices Meeting 2002*, (2002), 423–426.

Park, Jaehoo, et al., "Chemical vapor deposition of HfO/sub 2/ thin films using a novel carbon–free precursor: characterization of the interface with the silicon substrate", *Journal of the Electrochemical Society, 149(1)*, (2002),G89–G94.

Poveshchenko, V P., et al., "Investigation of the phas composition of films of zirconium, hafnium and yttrium oxides", *Soviet Journal of Optical Technology, 51(5)*, (1984),277–279.

Robertson, J. , "Band offsets of wide–band–gap oxides and implications for future electronic devices", *Journal of Vacuum Science & Technology B (Microelectronics and Nanometer Structures), 18(3)* (May–Jun. 2000),1785–1791.

Tavel, B , et al., "High performance 40 nm nMOSFETs with HfO/sub 2/ gate dielectric and polysilicon damascene gate", *Technical Digest of International Electron Devices Meetings 2002*, (2002),429–432.

Zhang, H , et al., "High permittivity thin film nanolaminates", *Journal of Applied Physics, 87(4)*, (Feb. 2000), 1921–1924.

Ahn, Kie Y., et al., "Ald of Amorphous Lanthanide Doped Tiox Films", *U.S. Application Ser. No. 11/092,072; filed Mar. 29, 2005*.

Ahn, Kie Y., et al., "Atomic Layer Deposited Hafnium Tantalum Oxide Dielectrics", *U.S. Appl. No. 11/029,757; filed Jan. 5, 2005*.

Ahn, Kie Y., et al., "Atomic Layer Deposited Lanthanium Aluminum Oxide Dielectric Layer", *U.S. Appl. No. 10/930,167; filed Aug. 31, 2004*.

Ahn, Kie Y., et al., "Atomic Layer Deposited Lanthanum Hafnium Oxide Dielectrics", *U.S. Appl. No. 11/010,529; filed Dec. 13, 2004*.

Ahn, Kie Y., et al., "Atomic Layer Deposited Titanium Aluminum Oxide Films", *U.S. Appl. No. 10/931,533; filed Aug. 31, 2004*.

Ahn, Kie Y., et al., "Atomic Layer Deposition of Hf3N4/HfO2 Films As Gate Dielectrics", *U.S. Appl. No. 11/063,717; filed Feb. 23, 2005*.

Ahn, Kie Y., et al., "Atomic Layer Deposition of Zirconium–Doped Tantalum Oxide Films", *U.S. Appl. No. 10/909,959; filed Aug. 2, 2004*.

Ahn, Kie Y., et al., "Atomic Layer Deposition of Zr3N4/ZrO2 Films As Gate Dielectrics", U.S. Appl. No. 11/058,563; filed Feb. 15, 2005.

Ahn, Kie Y., et al., "Hybrid ALD–CVD of PrXOY/ZrO2 Films As Gate Dielectrics", *U.S. Appl. No. 11/010,766; filed Dec. 13, 2004*.

Ahn, Kie Y., et al., "Ruthenium Gate For A Lanthanide Oxide Dielectric Layer", *U.S. Appl. No. 10/926,812; filed Aug. 26, 2004*.

Chin, A., et al., "High Quality La2O3 and Al2O3 Gate Dielectrics with Equivalent Oxide Thickness 5–10A", *Digest of Technical Papers 2000 Symposium on VLSI Technology, 2000*, Honolulu, (Jun. 13–15, 2000), 16–17.

Copel, M., et al., "Formation of a stratified lanthanum silicate dielectric by reaction with Si(001)", *Applied Physics Letters, 78(11)*, (Mar. 12, 2001), 1607–1609.

Dimoulas, A., et al., "Structural and electrical quality of the high–k dielectric Y2O3 on Si (001): Dependence on growth parameters", *Journal of Applied Physics, 92(1)*, (Jul. 1, 2002), 426–431.

Guha, S, et al., "Atomic beam deposition of lanthanum–and yttrium–based oxide thin films for gate dielectrics", *Applied Physics Letters, 77*, (2000), 2710–2712.

Huang, C. H., et al., "La/sub 2/O/sub 3//Si/sub 0.3/Ge/sub 0.7/ p–MOSFETs with high hole mobility and good device characteristics", *IEEE Electron Device Letters, 23(12)*, (Dec. 2002), 710–712.

Iwai, H., et al., "Advanced gate dielectric materials for sub–100 nm CMOS", *International Electron Devices Meeting, 2002. IEDM '02. Digest.*, (Dec. 8–11, 2002) 625–628.

Maria, J. P., et al., "High temperature stability in lanthanum and zirconia–based gate dielectrics", *Journal of Applied Physics, 90(7)*, (Oct. 1, 2001), 3476–3482.

Michaelson, Herbert B., "The work function of the elements and its periodicity", *Journal of Applied Physics, 48(11)*, (Nov. 1977), 4729–4733.

Yamada, Hirotoshi, et al., "MOCVD of High–Dielectric – Constant Lanthanum Oxide Thin Films", *Journal of The Electrochemical Society, 150(8)*, (Aug. 2003), G429–G435.

\* cited by examiner

LANTHANIDE OXIDE / HAFNIUM OXIDE DIELECTRICS

CROSS REFERENCE TO RELATED APPLICATIONS

This application is related to the co-filed and commonly assigned U.S. patent application, Ser. No. 10/602,323, entitled "Lanthanide Oxide/Hafnium Oxide Dielectric Layers," which is hereby incorporated by reference in its entirety.

TECHNICAL FIELD

This application relates generally to semiconductor devices and device fabrication and, more particularly, to dielectric layers and their method of fabrication.

BACKGROUND

The semiconductor device industry has a market driven need to improve speed performance, improve its low static (off-state) power requirements, and adapt to a wide range of power supply and output voltage requirements for its silicon based microelectronic products. In particular, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a transistor according to the present invention. A transistor 100 is fabricated in a substrate 110 that is typically silicon. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one design criteria is gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. However, increased scaling and other requirements in microelectronic devices have created the need to use other dielectric materials as gate dielectrics.

SUMMARY

The abovementioned problems are addressed by the present invention and will be understood by reading and studying the following specification. An embodiment for a method for forming a dielectric layer containing a hafnium oxide and a lanthanide oxide includes forming a layer of hafnium oxide by chemical vapor deposition and forming a layer of lanthanide oxide by electron beam evaporation. The layer of hafnium oxide is adjacent to and in contact with the layer of lanthanide oxide. In an embodiment, a dielectric layer includes a hafnium oxide/lanthanide oxide nanolaminate having a chemical vapor deposited hafnium oxide layer and an electronic beam evaporated lanthanide oxide layer.

Dielectric layers containing a chemical vapor deposited hafnium oxide layer and an electronic beam evaporated lanthanide oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. Embodiments include structures for capacitors, transistors, memory devices, and electronic systems with dielectric layers containing a chemical vapor deposited hafnium oxide layer and an electronic beam evaporated lanthanide oxide layer, and methods for forming such structures.

These and other aspects, embodiments, advantages, and features will become apparent from the following description and the referenced drawings.

DETAILED DESCRIPTION

Figure 1:
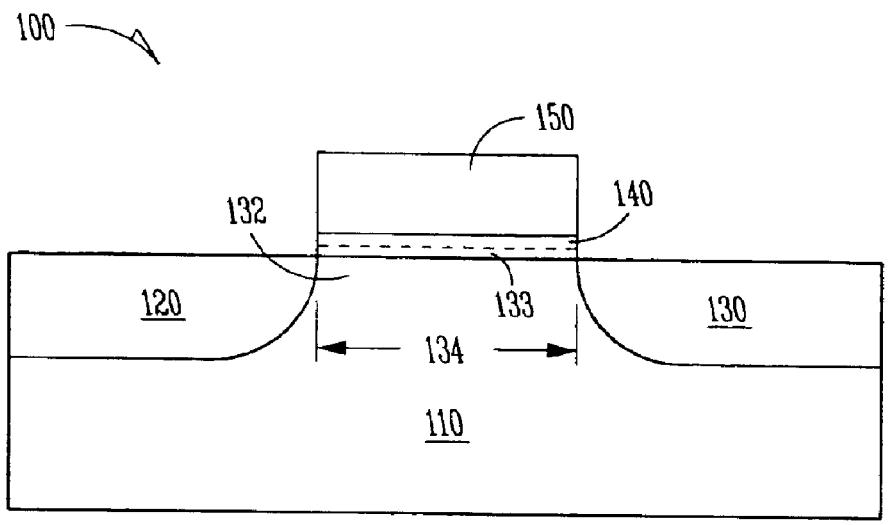
FIG. 1 shows a configuration of a transistor having a gate dielectric containing a chemical vapor deposited hafnium oxide layer and an electronic beam evaporated lanthanide oxide layer, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC). The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

In various embodiments, a dielectric layer includes a hafnium oxide layer and a lanthanide oxide layer, where the hafnium oxide layer is formed by chemical vapor deposition (CVD) and the lanthanide oxide layer is formed by electron beam evaporation. The lanthanide oxide can be selected from $Pr_2O_3$, $Nd_2O_3$, $Sm_2O_3$, $Gd_2O_3$, and $Dy_2O_3$. In an embodiment, a dielectric layer includes a hafnium oxide/lanthanide oxide nanolaminate.

The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range, up to several tens of nanometers. Further, each individual material layer of the nanolaminate can have a thickness as low as a monolayer of the material. A nanolaminate of hafnium oxide and a lanthanide oxide includes at least one thin layer of hafnium oxide, and one thin layer of the lanthanide oxide, which can be written as a nanolaminate of hafnium oxide/lanthanide oxide. Further, a hafnium oxide/lanthanide oxide nanolaminate is not limited to alternating one lanthanide layer after a hafnium oxide layer, but can include multiple thin layers of a lanthanide oxide alternating with multiple thin layers of hafnium oxide. Further, the number of thin layers of lanthanide oxide and the number of thin layers of hafnium oxide can vary independently within a nanolaminate structure. Additionally, a hafnium oxide/lanthanide oxide nanolaminate can include layers of different lanthanide oxides, where each layer is independently selected from $Pr_2O_3$, $Nd_2O_3$, $Sm_2O_3$, $Gd_2O_3$, and $Dy_2O_3$. A dielectric layer containing alternating layers of a lanthanide oxide and a hafnium oxide has an effective dielectric constant related to the series combination of the layers of lanthanide oxide and hafnium oxide, which depends on the relative thicknesses of the lanthanide oxide layers and the hafnium oxide layers. Thus, a dielectric containing a hafnium oxide/lanthanide oxide nanolaminate can be engineered to effectively provide a selected dielectric constant.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. The equivalent oxide thickness, $t_{eq}$, is defined as the thickness of a theoretical $SiO_2$ layer that would have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region may result in $t_{eq}$ being from 3 to 6 Angstroms (Å) larger than the $SiO_2$ thickness, t. Thus, with the semiconductor industry driving to scale the gate dielectric equivalent oxide thickness to under 10 Å, the physical thickness for a $SiO_2$ layer used for a gate dielectric would be need to be approximately 4 to 7 Å.

Additional characteristics for a $SiO_2$ layer depend on the gate electrode used in conjunction with the $SiO_2$ gate dielectric. Using a conventional polysilicon gate results in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large bandgap of $SiO_2$ (8.9 eV) making it a good insulator from electrical conduction. Signification reductions in its bandgap would eliminate it as a material for a gate dielectric. As the thickness of a $SiO_2$ layer decreases, the number of atomic layers, or monolayers of the $SiO_2$ decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full bandgap. The lack of a full bandgap in a $SiO_2$ gate dielectric could cause an effective short between an underlying Si channel and an overlying polysilicon gate. This undesirable property sets a limit on the physical thickness to which a $SiO_2$ layer may be scaled. The minimum thickness due to this monolayer effect is thought to be about 7–8 Å. Therefore, for future devices to have a $t_{eq}$ less than about 10 Å, dielectrics other than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that may be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced $t_{eq}$ for transistors may be realized by using dielectric materials with higher dielectric constants than $SiO_2$. The thinner $t_{eq}$ for lower transistor operating voltages and smaller transistor dimensions may be realized by a significant number of materials, but additional fabricating characteristics makes determining a suitable replacement for $SiO_2$ difficult.

The current view for the microelectronics industry is still for Si based devices. Thus, the gate dielectric employed will grow on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. Thus, use of an ultra-thin silicon dioxide interface layer should be limited to significantly less than ten angstroms. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages for using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric may cause variations in the layer's dielectric constant. Many materials having a high dielectric constant relative to $SiO_2$ also have a disadvantage of a crystalline form, at least in a bulk configuration. Thus, the best candidates for replacing $SiO_2$ as a gate dielectric are those with high dielectric constant, a relatively large bandgap, and are able to be fabricated as a thin layer with an amorphous form.

Materials such as $Ta_2O_3$, $TiO_2$, $Al_2O_3$, $HfO_2$, $HfSi_xO_y$, $HfSi_xO_y$, and barium strontium titanate (BST) have been proposed as replacements for $SiO_2$ as gate dielectric materials. Additional materials have been proposed to not only provide a material layer with a dielectric constant greater than silicon dioxide, but also to provide adjustment to the insulating properties of the material. Such materials can be provided as nanolaminates, for example, $Ta_2O_5/HfO_2$, $ZrO_2/HfO_2$, $Ta_2O_5/HfO_2$ nanolaminates. Providing dielectric layers configured as nanolaminates can provide a dielectric layer with relatively low leakage current properties.

In an embodiment of the present invention, a dielectric film having a chemical vapor deposited hafnium oxide and an electron beam evaporated lanthanide oxide allows for the engineering of a dielectric layer with a dielectric constant significantly higher than that of silicon dioxide and a relatively low leakage current characteristic. Using layers of chemical vapor deposited $HfO_2$ in various embodiments, provides layers, as compared to $ZrO_2$, that have a stronger tendency to form a single phase structure, a higher refractive index when deposited at low temperatures, a larger band gap, higher band offsets on silicon, and better thermal stability against silicide formation. Additionally, amorphous lanthanide oxides provide high oxide capacitance, low leakage current, and high thermal stability.

Another consideration for selecting materials for forming a dielectric layer concerns the roughness of the dielectric layer on a substrate. Surface roughness of the dielectric layer has a significant effect on the electrical properties of the gate oxide, and the resulting operating characteristics of the transistor. Leakage current through a physical 1.0 nanometer gate oxide has been found to be increased by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High-energy impacts remove body region particles creating pits. The surface of such a deposited layer may have a rough contour due to the rough interface at the body region.

Additionally, the localized non-flat surface morphology of CMOS devices, especially at edges of shallow trench isolations, may make a sputtering process a non-ideal process for CMOS fabrication. Further, a sputtering process introduces the possibility of a damaging effect to the channel region of CMOS devices. Using an alternate metalorganic chemical vapor deposition (MOCVD) process may introduce carbon contamination into a sensitive channel region of a CMOS device, since a MOCVD precursor contains carbon.

In an embodiment, a hafnium oxide layer is formed on a substrate by chemical vapor deposition using a precursor that does not contain carbon or other harmful elements. Further, a CVD precursor can be used that also does not contain chlorine or other halogens. A lanthanide oxide layer is then formed on the hafnium oxide layer, where the lanthanide oxide layer is formed by electron beam evaporation.

Figure 2:
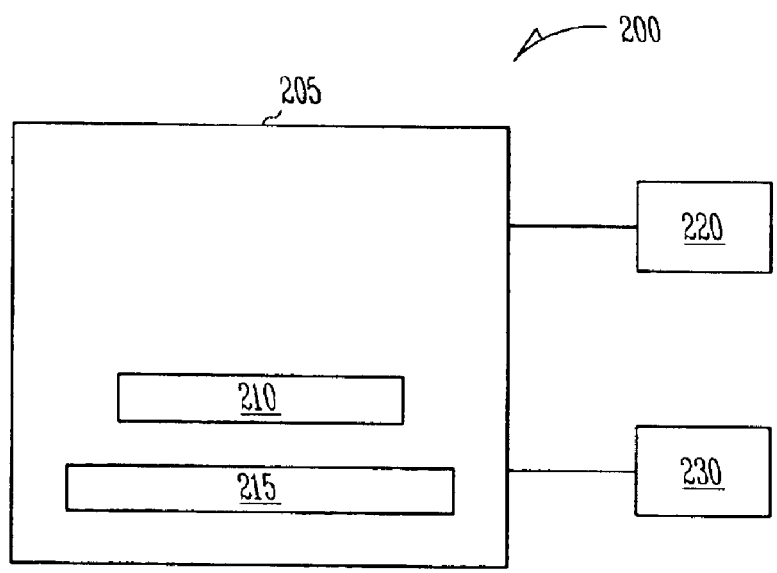
FIG. 2 depicts a block diagram for a chemical vapor deposition system for processing a layer of hafnium oxide for a dielectric layer containing a hafnium oxide and a lanthanide oxide, according to various embodiments of the present invention.

FIG. 2 depicts a block diagram for an embodiment of a chemical vapor deposition system 200 for processing a layer of hafnium oxide for a dielectric layer containing a hafnium oxide and a lanthanide oxide. Commercial CVD systems are available that can be used for practicing embodiments of the present invention. Those of ordinary skill in the art of semiconductor fabrication understand the use, construction and fundamental operation of chemical vapor deposition chambers for deposition of material layers. Additionally, the elements of a CVD system such as system 200 may be controlled by a computer. To focus on the use of CVD system 200 in the various embodiments of the present invention, the computer is not shown in the block diagram of FIG. 2.

Chemical vapor deposition system 200 includes a CVD reaction chamber 205 in which a substrate 210 is mounted in close proximity to a heater 215. Heater 215 is used to maintain substrate 210 at a given temperature during CVD processing. Heater 215 may be used according to various types and configurations of heaters, and arranged in a wide variety of orientations with respect to substrate 210 as are known to those skilled in the art. CVD system 200 also includes a source 220 for a hafnium containing precursor as well as for a carrier gas for the hafnium containing precursor. An additional source 230 provides oxygen gas with an associated carrier gas, such as argon.

Figure 3:
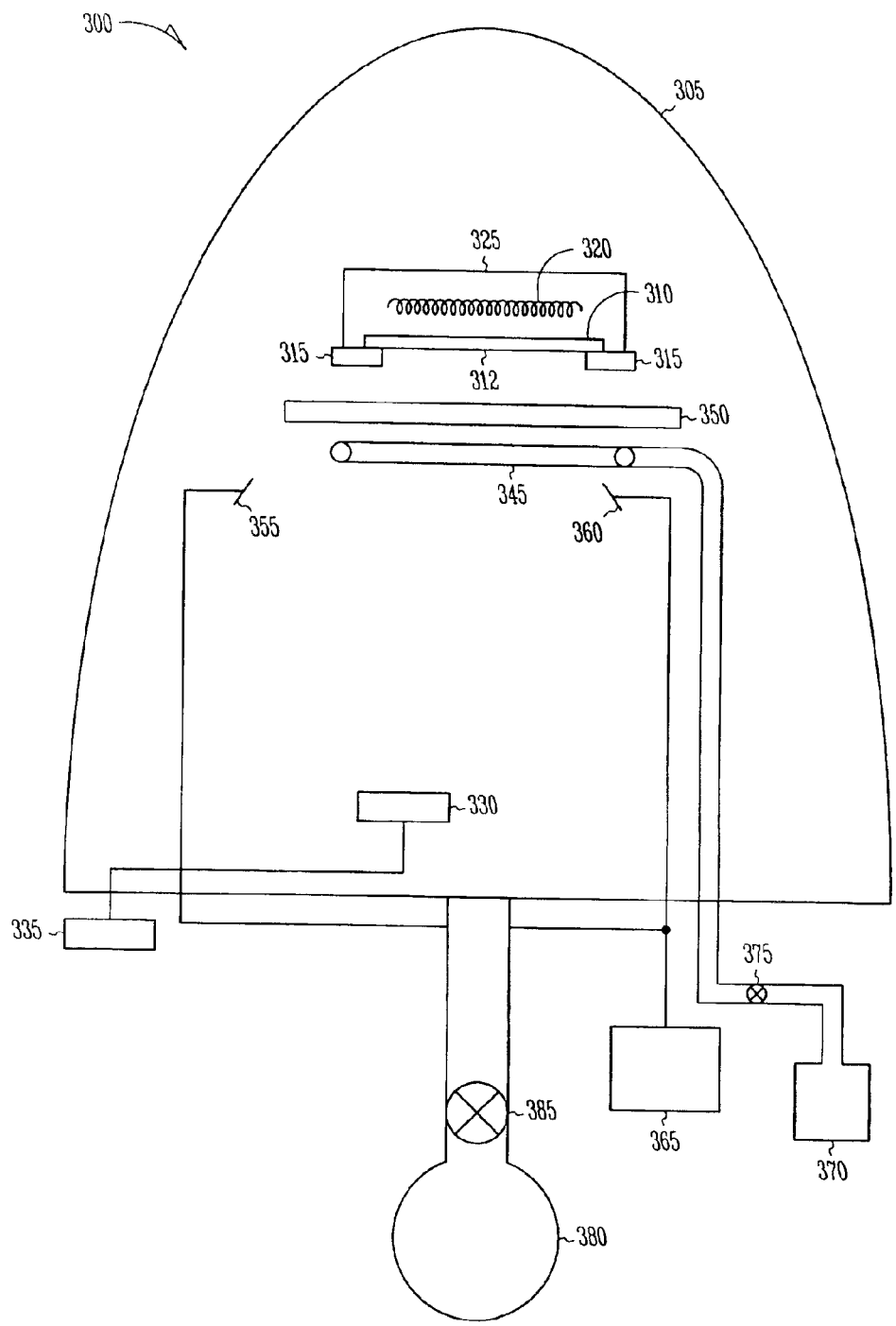
FIG. 3 depicts an electron beam evaporation system for processing a layer of lanthanide oxide for a dielectric layer containing a hafnium oxide and a lanthanide oxide, according to various embodiments of the present invention.

FIG. 3 depicts an electron beam evaporation system 300 for processing a layer of lanthanide oxide for a dielectric layer containing a hafnium oxide and a lanthanide oxide. Evaporation system 300 includes a reaction chamber 305 in which is located a substrate 310 having a surface 312 that is to be processed. Substrate 310 rests on substrate holder 315 and its temperature can be raised above room temperature using a heater 320 with its associated reflector 325. Evaporation system 300 also includes an electron gun device 330 regulated by electron gun controller 335 for depositing material on substrate surface 312.

Material evaporated using electron gun device 330 travels to substrate 310 through an ionizer ring 345 and shutter 350. Ionizer ring 345 provides supplemental oxygen for processes that require additional oxygen due to lost of oxygen in the evaporation of target materials. For target materials substantially void of oxygen, ionizer ring 345 provides initial oxygen to a film deposited on substrate surface 312 that is to undergo a subsequent oxidation process. Shutter 350 is used in conjunction with the control of electron gun device 330 to control the growth rate of a film on substrate 310. The growth rate is determined using quartz crystal monitors 355, 360. The quartz crystal monitors 355, 360 are coupled to a thickness/rate control 365, typically located outside reaction chamber 305.

Also located outside reaction chamber 305 is an oxygen gas source 370 including a mass-flow controller 375. In an embodiment, the oxygen gas source is ozone gas. Mass-flow controller 375 controls the flow of the oxygen source into reaction chamber 305. Further, a vacuum pump 380 with mass flow controller 385 maintains the overall atmosphere of evaporation system 300 at desired levels prior to, during, and after evaporation.

Electron gun device 330 can include an electron gun and receptacle for a target material that is to be evaporated. Target material placed in the target receptacle of electron gun device 330 is heated by impact from an electron beam from its associated electron gun. The electron beam is generated with an intensity and duration with which to evaporate the material in the target receptacle of electron gun device 330. The evaporated material then distributes throughout the reaction chamber 305. The evaporated material and pre-evaporation contaminants are prevented from depositing on substrate surface 312 in an unwanted manner by shutter 350. Further, electron gun device can be realized using commercially available devices as are known to those skilled in the art.

Ionizer ring 345 provides oxygen necessary to compensate for loss of oxygen in the evaporated target material, or to add initial oxygen for subsequent oxidation processing. In one embodiment, it includes a ring with a center axis. The ring has a plurality of openings adapted to direct oxygen flowing to ionizer ring 345 from oxygen gas source 370 towards substrate surface 312. Oxygen is uniformly distributed to substrate surface 312 by ionizer ring 345 positioned generally parallel to substrate 310.

The electron beam evaporation chamber 300 can be included as part of an overall processing system including CVD system 200 of FIG. 2. To avoid contamination of the surface of a layer formed by chemical vapor deposition, evaporation chamber 300 can be connected to CVD system 200 using sealable connections to maintain the substrate, which is substrate 210 in FIG. 2 and substrate 310 of FIG. 3, in an appropriate environment between CVD processing of a hafnium oxide layer and electron beam evaporation of a lanthanide oxide layer. Other means as are known to those skilled in the art can be employed for maintaining an appropriate environment between different processing procedures.

Figure 4:
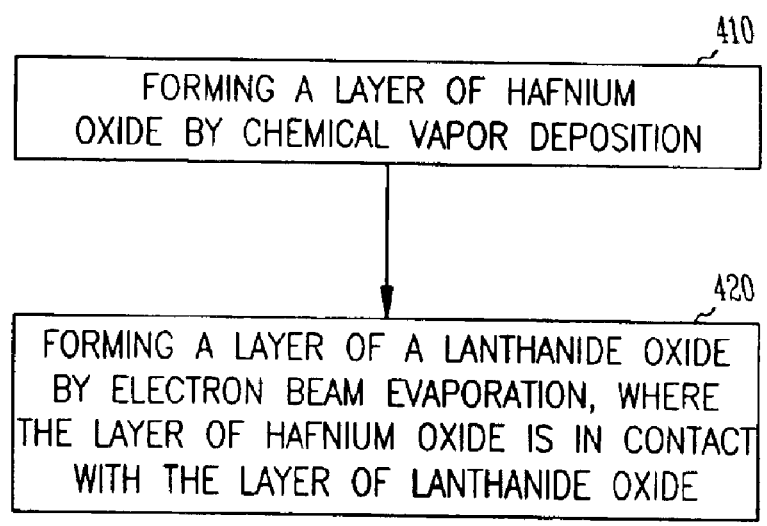
FIG. 4 illustrates a flow diagram of elements for an embodiment of a method to process a dielectric layer containing a chemical vapor deposited hafnium oxide layer and an electronic beam evaporated lanthanide oxide layer, according to the present invention.

FIG. 4 illustrates a flow diagram of elements for an embodiment of a method to process a dielectric layer containing a chemical vapor deposited hafnium oxide layer and an electronic beam evaporated lanthanide oxide layer. This embodiment includes forming a layer of hafnium oxide by chemical vapor deposition, at block 410, and forming a layer of a lanthanide oxide by electron beam evaporation, at block 420, where the layer of hafnium oxide is adjacent to and in contact with the lanthanide oxide layer. The lanthanide oxide can be selected from $Pr_2O_3$, $Nd_2O_3$, $Sm_2O_3$, $Gd_2O_3$, and $Dy_2O_3$. In an embodiment the method includes forming the layer of hafnium oxide on a substrate and forming the layer of lanthanide oxide on the layer of hafnium oxide. Alternately, a layer of lanthanide oxide is formed on a substrate and a layer of hafnium oxide is formed on the layer of lanthanide oxide. In an embodiment, the method includes controlling the forming of the layer of hafnium oxide and the layer of the lanthanide oxide to form a lanthanide oxide/hafnium oxide nanolaminate. The nanolaminate may have multiple layers of different lanthanide oxides selected from $Pr_2O_3$, $Nd_2O_3$, $Sm_2O_3$, $Gd_2O_3$, and $Dy_2O_3$.

For a dielectric layer having a hafnium oxide layer and one or more layers of a lanthanide oxide, the combined thickness of lanthanide oxide layers can be limited to a total thickness between about 2 nanometers and about 10 nanometers. Also, for a dielectric layer having a lanthanide oxide layer and one or more layers of hafnium oxide, the combined thickness of hafnium oxide layers can be limited to a total thickness between about 2 nanometers and about 10 nanometers. In an embodiment, hafnium oxide layers are limited to between about 2 nanometers and about 5 nanometers. In an embodiment, a dielectric layer includes a hafnium oxide layer and multiple layers of lanthanide oxide, where each layer of lanthanide oxide is limited to a thickness between about 2 nanometers and about 10 nanometers.

Figure 5:
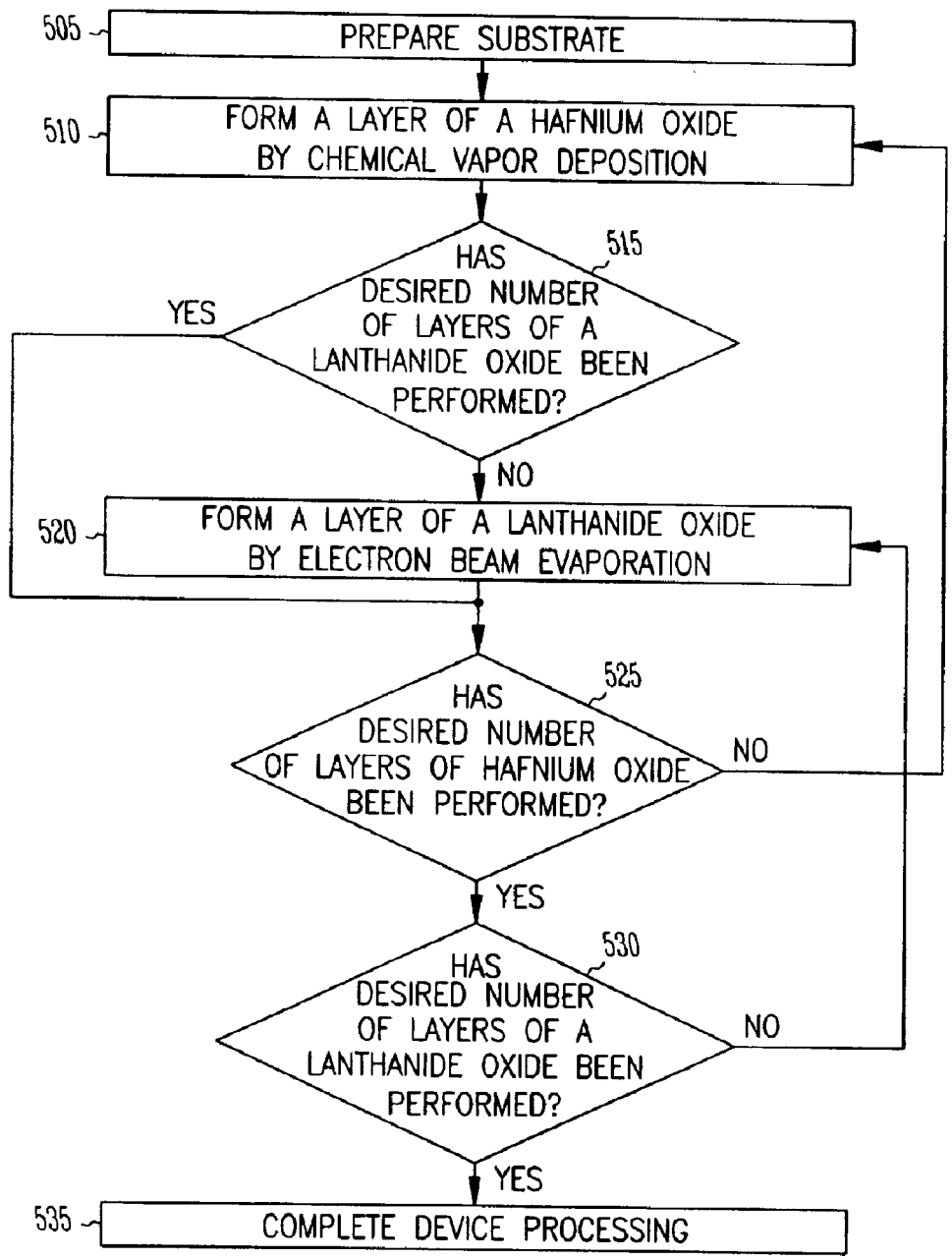
FIG. 5 illustrates a flow diagram of elements for an embodiment of a method to process a dielectric layer containing a chemical vapor deposited hafnium oxide layer and an electronic beam evaporated lanthanide oxide layer, according to the present invention.

FIG. 5 illustrates a flow diagram of elements for an embodiment of a method to process a dielectric layer containing a chemical vapor deposited hafnium oxide layer and an electronic beam evaporated lanthanide oxide layer. In an embodiment, the method depicted in FIG. 5 can be used to form a gate dielectric layer for a transistor. This embodiment may be implemented with the chemical vapor deposition system 200 of FIG. 2, and the electron beam evaporation system of FIG. 3.

At block 505, substrate 210 is prepared. Substrate 210 used for forming a transistor is typically a silicon or silicon containing material. In other embodiments, germanium, gallium arsenide, silicon-on-sapphire substrates, or other suitable substrates may be used. This preparation process may include cleaning of substrate 210 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric acid, HF, rinse prior to CVD processing to provide the silicon substrate with a hydrogen-terminated surface without a native silicon oxide layer.

In an embodiment, substrate 210 is prepared as a chemical oxide-terminated silicon surface prior to forming a hafnium oxide by chemical vapor deposition. This preparation allows for forming an interface layer to provide a structure that may further aid in reducing the leakage current through the dielectric layer.

The sequencing of the formation of the regions of the transistor being processed follows typical sequencing that is generally performed in the fabrication of a MOS transistor as is well known to those skilled in the art. Included in the processing is the masking of substrate regions to be protected during the gate dielectric formation, as is typically performed in MOS fabrication. In this embodiment, the unmasked region may include a body region of a transistor; however one skilled in the art will recognize that other semiconductor device structures may utilize this process. Additionally, substrate 210 in its ready for processing form is conveyed into a position in reaction chamber 205 for CVD processing.

At block 510, a layer of hafnium oxide is formed by chemical vapor deposition. In an embodiment, a sublimation technique is used for precursor delivery, where the precursor material is solid and held in source 220 and the substrate is maintained at a temperature ranging from about 200° C. to about 400° C. The sublimation temperature is maintained at about 63° C. with a vapor pressure of about 5 Torr. The precursor material is a hafnium-nitrato ($Hf(NO_3)_4$) precursor with an argon carrier gas. Oxygen along with an argon carrier gas is provided from source 230. Alternately, the hafnium oxide layer can be formed without providing additional oxygen from source 230 with oxygen for the hafnium oxide provided by the decomposition of the $Hf(NO_3)_4$ precursor. Utilizing $Hf(NO_3)_4$ as the precursor for the chemical vapor deposition allows the use of only nitrogen and oxygen. As a result, carbon is not introduced into the device being process during the formation of the hafnium oxide layer. Further, no halogen, such as chlorine, is introduced into the device since a halide is not used. For embodiments in which the introduction of carbon or halogen residue is not a significant detriment, other hafnium-containing precursors, such as $C_{16}H_{36}HfO_4$, $HfI_4$, and $HfCl_4$, can be used in the CVD processing of the hafnium oxide layer. Also, other CVD techniques may be used to form the hafnium oxide layer.

Upon forming the CVD hafnium oxide layer, a determination is made as to whether the desired number of layers of a lanthanide oxide has been formed, at block 515. If the desired number of layers of a lanthanide oxide has been made, a determination is made as to whether the desired number of layers of hafnium oxide has been processed, at block 525. Such a case may occur in embodiments for a dielectric layer having hafnium oxide formed as consecutive layers on a lanthanide oxide layer. If more layers of hafnium oxide are required for the given application, the overall process continues as a chemical vapor deposition, at block 510.

If it is determined, at block 515, that the desired number of layers of a lanthanide oxide has not been formed, then a layer of lanthanide oxide is formed on substrate 210, at block 520, which may include hafnium oxide layers and other lanthanide oxide layers. Substrate 210 in the CVD system, as depicted in the block diagram of FIG. 2, is moved into the evaporation system depicted in FIG. 3, where the substrate 210, with its formed layers, becomes substrate 310 of FIG. 3. To avoid contamination of the surface of a layer formed by chemical vapor deposition, evaporation chamber 300 can be connected to CVD system 200 using sealable connections to maintain the substrate in an appropriate environment between CVD processing of a hafnium oxide layer and electron beam evaporation of a lanthanide oxide layer. Other means as are known to those skilled in the art can be employed for maintaining an appropriate environment between different processing procedures.

Substrate 310, suitably masked for the given application and process procedures, is moved into evaporation chamber 305. Electron gun 330 contains a receptacle for a source target on which an electron beam is directed. Electron gun controller 335 regulates the rate of evaporation of material from the target source. Alternatively, evaporation chamber 305 can include multiple electron guns, where each electron gun is directed to different targets containing sources to form selected lanthanide oxides to be used at different times in the process.

In an embodiment, the target source of electron gun 330 contains a ceramic $Pr_6O_{11}$ source, which is evaporated due to the impact of the electron beam. The evaporated material is then distributed throughout the chamber 305. A dielectric layer of $Pr_2O_3$ is grown on surface 312 of substrate 310, which is maintained at a temperature ranging from about 100° C. to about 150° C. The growth rate can vary with a typical rate of 0.1 Å/s. In an embodiment in which a lanthanide is first formed on a substrate prior to forming a hafnium oxide layer, a $Pr_2O_3$ layer may include a thin amorphous interfacial layer separating a crystalline layer of $Pr_2O_3$ from the substrate on which it is grown. This thin amorphous layer may be beneficial in reducing the number of interface charges and eliminating any grain boundary paths for conductance from the substrate. Other source materials can be used for forming a $Pr_2O_3$ layer, as are known to those skilled in the art.

Alternately, the lanthanide oxide layer formed by electron beam evaporation for a dielectric layer containing a chemical vapor deposited hafnium oxide and a lanthanide oxide can be an oxide selected from $Nd_2O_3$, $Sm_2O_3$, $Gd_2O_3$, or $Dy_2O_3$. Further, a dielectric layer may include a number of hafnium oxide layers and a number of lanthanide oxide layers, where the lanthanide oxide layers are different lanthanide oxides. The different lanthanide oxides can be selected from $Pr_2O_3$, $Nd_2O_3$, $Sm_2O_3$, $Gd_2O_3$, and $Dy_2O_3$. The source material for the particular lanthanide oxide is chosen from commercial materials for forming the lanthanide oxide by electron bean evaporation, as is known by those skilled in the art.

After forming the layer of lanthanide oxide, at block 520, a determination is made as to whether the desired number of hafnium oxide layers has been formed, at block 525. If the desired number of hafnium oxide layers has not been formed, substrate 310 is moved back into chemical vapor deposition system 200 and the process continues, at block 510. If it is determined that the desired number of hafnium oxide layers have been formed, at block 525, it is then determined whether the desired number of layers of a lanthanide oxide have been formed, at block 530. If the desired number of lanthanide oxide layers has not been formed, a layer of lanthanide oxide is formed by electron beam evaporation, at block 520, and the process continues. If is determined that the desired number of lanthanide oxide layers has been formed, at block 530, and if the desired number of hafnium oxide layers has been formed, then the substrate is further processed to complete device processing, at block 535.

If the dielectric layer containing a chemical vapor deposited hafnium oxide and an electron beam evaporated lanthanide oxide has been formed to have the desired thickness, the growth of the dielectric layer is complete. The dielectric layer may be annealed. To avoid the diffusion of oxygen during annealing to the semiconductor substrate surface, annealing may be performed in an oxygen-free environment for short periods of time. An embodiment of an annealing environment may include a nitrogen atmosphere. In addition to limiting or avoiding oxygen diffusion to the semiconductor substrate, the relatively low processing temperatures employed by chemical vapor deposition of the hafnium oxide layers and by electron beam evaporation of the lanthanide layers allows for the formation of an amorphous dielectric layer.

At block 535, after forming the dielectric film containing chemical vapor deposited hafnium oxide and electron beam deposited lanthanide oxide, processing the device having this dielectric layer is completed. In an embodiment, completing the device includes completing the formation of a transistor. In an embodiment, completing the device includes completing the formation of a capacitor. In an embodiment, completing the process includes completing the construction of a memory device having an array with access transistors formed with gate dielectrics containing chemical vapor deposited hafnium oxide and electron beam deposited lanthanide oxide. In an embodiment, completing the process includes the formation of an electronic system including an information handling device that uses electronic devices with transistors formed with dielectric layers having a chemical vapor deposited hafnium oxide and an electron beam deposited lanthanide oxide.

Upon reading and comprehending this disclosure, it can be appreciated by those skilled in the art that the elements of a method for forming a dielectric layer containing chemical vapor deposited hafnium oxide and electron beam deposited lanthanide oxide in the embodiment of FIG. 5 may be performed under various environmental conditions, including various pressures and temperatures, for a given application and the systems used to fabricate such a dielectric layer. Determination of the environmental conditions, precursors used, and electron beam target materials may be made without undue experimentation.

The elements for a method for forming a dielectric layer containing a chemical vapor deposited hafnium oxide and an electron beam deposited lanthanide oxide as illustrated in FIG. 5 can vary and include numerous permutations. In an embodiment, a chemical vapor deposited hafnium oxide layer is formed on a substrate and an electron beam evaporated lanthanide oxide layer is formed on the hafnium oxide layer. Alternately, an electron beam evaporated lanthanide oxide layer is formed on a substrate and a chemical vapor deposited hafnium oxide layer is deposited on the lanthanide oxide layer. A hafnium oxide layer may be formed as multiple layers of chemical vapor deposited hafnium oxide. Similarly, a lanthanide oxide layer may be formed as multiple layers of an electron beam evaporated lanthanide oxide. Additionally, a dielectric layer may contain multiple layers of lanthanide oxide, where two or more layers contain different lanthanide oxides selected from $Pr_2O_3$, $Nd_2O_3$, $Sm_2O_3$, $Gd_2O_3$, and $Dy_2O_3$.

In an embodiment, a dielectric containing a chemical vapor deposited hafnium oxide and an electron beam evaporated lanthanide oxide is formed as a nanolaminate. The nanolaminate may have multiple layers of different lanthanide oxides selected from $Pr_2O_3$, $Nd_2O_3$, $Sm_2O_3$, $Gd_2O_3$, and $Dy_2O_3$. For a dielectric layer having a hafnium oxide layer and one or more layers of a lanthanide oxide, the combined thickness of lanthanide oxide layers can range from about 2 nanometers to about 10 nanometers. Also, for a dielectric layer having a lanthanide oxide layer and one or more layers of hafnium oxide, the combined thickness of hafnium oxide layers can range from about 2 nanometers to about 10 nanometers. In an embodiment, the combined thickness of the hafnium oxide layers ranges from about 2 nanometers to about 5 nanometers. In an embodiment, a dielectric layer includes a hafnium oxide layer and multiple layers of lanthanide oxide, where each layer of lanthanide oxide has a thickness ranging from about 2 nanometers to about 10 nanometers. In an embodiment, a dielectric layer includes a lanthanide oxide layer and multiple layers of hafnium oxide, where each layer of hafnium oxide has a thickness ranging from about 2 nanometers to about 10 nanometers. In an embodiment, a dielectric layer containing a chemical vapor deposited hafnium oxide layer and an electron beam evaporated lanthanide oxide layer has a thickness ranging from about 2 nanometers to about 20 nanometers.

A dielectric layer containing a chemical vapor deposited hafnium oxide and an electron beam deposited lanthanide oxide may be processed in a chemical vapor deposition system such as CVD system 200 and evaporation system 300 under computer control. Instructions stored in a computer readable medium are executed by a computer to accurately control the integrated functioning of the elements of chemical vapor deposition system 200 and evaporation system 300 to form a dielectric layer containing hafnium oxide and a lanthanide oxide, according to various embodiments. The computer-executable instructions may be provided in any computer-readable medium. Such computer-readable medium may include, but is not limited to, floppy disks, diskettes, hard disks, CD-ROMS, flash ROMS, nonvolatile ROM, and RAM.

Dielectric layers containing chemical vapor deposited hafnium oxide layers and electron beam evaporated lanthanide oxide layers can have a wide range of dielectric constants determined by the series configuration and relative thickness of the hafnium oxide layers and the lanthanide oxide layers. In bulk form, $HfO_2$ has a dielectric constant of about 25. Bulk $Pr_2O_3$ has a dielectric constant of about 31, while the dielectric constants for $Nd_2O_3$, $Sm_2O_3$, $Gd_2O_3$, and $Dy_2O_3$, in bulk form, are generally also in the range of 25–30. Consequently, a dielectric layer containing bulk layers of hafnium oxide and lanthanide oxide could be expected to have a dielectric constant engineered in the range from about 25 to about 31. Such a dielectric layer would have a $t_{eq}$ that is about one-sixth to one-eight smaller than a silicon oxide layer of the same thickness.

However, a thin dielectric layer with an interfacial layer formed between the surface of the substrate and the first layer of a hafnium oxide or a lanthanide oxide will have a $t_{eq}$ that is based on an interfacial layer physically in parallel with the dielectric layer equivalently forming a series configuration of electrical structures. Thus, the dielectric layer formed having an interfacial layer between it and the substrate on which it is grown can have an effective dielectric constant considerably less than a dielectric constant associated with the combination of hafnium oxide and lanthanide oxide layers.

Effective dielectric constants associated with thin layers of $Pr_2O_3$, $Nd_2O_3$, $Sm_2O_3$, $Gd_2O_3$, and $Dy_2O_3$ oxides on silicon have been reported to have dielectric constants in the range of 11 to 15 with interfacial regions having a thickness in the of about 0.5 nm to about 1.1 nm. See J. Sanghun et al., *Technical Divest of International Electron Devices Meetings* 2001, pp. 471–474 (2001). Similarly, chemical vapor deposited $HfO_2$ also has been reported to have an effective dielectric constant reduced from its bulk value to a value in the range of 18 to 22 when formed as a thin layer on a silicon substrate with an interfacial layer. See J. Park et al., *Journal of the Electrochemical Society*, vol. 149: no. 1, pp. G89–G94 (2002). The effective dielectric constants for thin dielectric layers containing any of these materials and/or combinations of these materials may be reduced from their bulk value depending on the thickness and material composition of any interfacial layer that may be formed.

Further, for those cases in which a dielectric layer containing chemical vapor deposited hafnium oxide and electron beam evaporated lanthanide oxide is formed with little or no interfacial layer, the dielectric layer may be subject to a thin film effect related to the abrupt termination of the film. A planar bulk or thick film can be considered as a bulk region with two surface regions. Due to the termination of the thick film, the properties of the two surface regions can vary from that of the bulk region. In a thick film, the effective properties of the film are dominated by the bulk region. In a thin film, including nanolaminates, the properties of the thin film are effectively controlled by two surface regions. See K. Natori et al., *Applied Physics Letters*, vol. 73: no. 5, pp. 632–634 (1998). Thus, thin films of hafnium oxide and lanthanide oxide may have effective dielectric constants reduced from their bulk values without being formed in a structure with interfacial regions. Without a size effect, dielectric layers containing hafnium oxide and lanthanide oxide may have a dielectric constant in the range of about 25 to about 31. With a size effect, dielectric layers containing hafnium oxide and lanthanide oxide may have dielectric constants in the range from about 11 to about 16.

The embodiments described herein provide a process for growing a dielectric layer containing a chemical vapor deposited hafnium oxide and an electron beam evaporated lanthanide oxide having a wide range of useful equivalent oxide thickness, $t_{eq}$. The relatively large dielectric constant for such a dielectric layer ranges from about 11 to about 31, depending on the presence of an interfacial layer and/or on a size effect. Forming a dielectric layer according to various embodiments with a thickness ranging from 2 nanometers to 20 nanometers allows for the engineering of dielectric layers achieving a $t_{eq}$ in the range of about 0.7 nanometers to about 7 nanometers. Without an interfacial layer and without a size effect, the $t_{eq}$ for such a dielectric layer may range from about 0.25 nanometers to about 2.5 nanometers. A dielectric layer containing a chemical vapor deposited hafnium oxide and an electron beam evaporated lanthanide oxide may be formed for applications with a $t_{eq}$ between 10 Å and 20 Å, or less than 10 Å.

Dielectric layers containing a chemical vapor deposited hafnium oxide and an electron beam evaporated lanthanide oxide using embodiments of the present invention may be engineered with various structures and compositions including an amorphous structure. Embodiments using low processing temperatures tend to provide an amorphous structure, which is better suited for reducing leakage current than structures exhibiting a polycrystalline structure or a partial polycrystalline structure.

Figure 6:
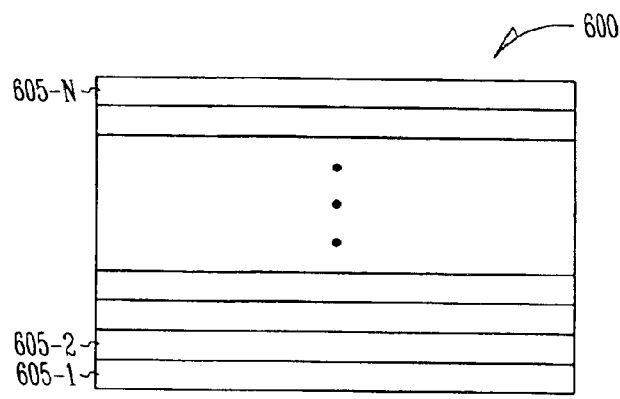
FIG. 6 depicts an embodiment of a dielectric layer including a nanolaminate of hafnium oxide and lanthanide oxide, according to the present invention.

FIG. 6 depicts a nanolaminate structure 600 for an embodiment of a dielectric structure including chemical vapor deposited hafnium oxide and electron beam evaporated lanthanide oxide. Nanolaminate structure 600 includes a plurality of layers 605-1 to 605-N, where each layer contains chemical vapor deposited hafnium oxide or electron beam evaporated lanthanide oxide. The sequencing of the layers depends on the application. The effective dielectric constant associated with nanolaminate structure 600 is that attributable to N capacitors in series, where each capacitor has a thickness defined by the thickness of the corresponding electron beam evaporated lanthanide oxide or chemical vapor deposited hafnium oxide layer. By selecting each thickness and the composition of each layer, electron beam evaporated lanthanide oxide or chemical vapor deposited hafnium oxide layer, a nanolaminate structure can be engineered to have a predetermined dielectric constant.

Embodiments for forming a dielectric layer including CVD processing of a hafnium oxide and processing of an lanthanide oxide by electron beam evaporation may be implemented to form transistors, capacitors, memory devices, and other electronic systems including electro-optic devices, microwave devices, and information handling devices. With careful preparation and engineering of the dielectric layer limiting the size of interfacial regions, a $t_{eq}$ less than about 10 Å for these devices is anticipated.

A transistor 100 as depicted in FIG. 1 may be constructed by forming a source region 120 and a drain region 130 in a silicon based substrate 110 where source and drain regions 120, 130 are separated by a body region 132. Body region 132 defines a channel having a channel length 134. A dielectric layer is disposed on substrate 110 formed as a layer containing a chemical vapor deposited hafnium oxide and an electron beam evaporated lanthanide oxide. The resulting dielectric layer forms gate dielectric 140.

A gate 150 is formed over gate dielectric 140. Typically, forming gate 150 may include forming a polysilicon layer, though a metal gate may be formed in an alternative process. An interfacial layer 133 may form between body region 132 and gate dielectric 140. In an embodiment, interfacial layer 133 may be limited to a relatively small thickness compared to gate dielectric 140, or to a thickness significantly less than gate dielectric 140 as to be effectively eliminated. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 7:
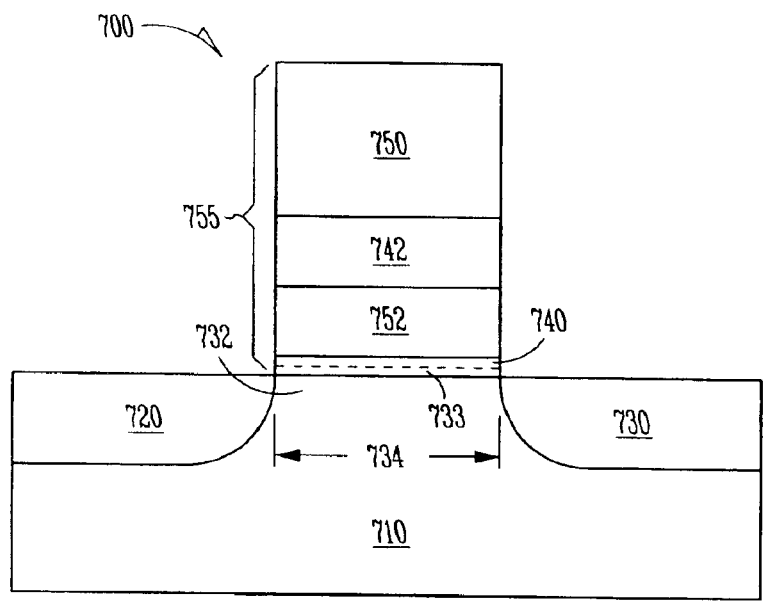
FIG. 7 shows an embodiment of a configuration of a transistor having a dielectric layer containing a chemical vapor deposited hafnium oxide layer and an electronic beam evaporated lanthanide oxide layer, according to the present invention.

The method for forming a dielectric layer containing a chemical vapor deposited hafnium oxide and an electron beam evaporated lanthanide oxide in various embodiments may be applied to other transistor structures having dielectric layers. FIG. 7 shows an embodiment of a configuration of a transistor 700 having a dielectric layer containing a chemical vapor deposited hafnium oxide and an electron beam evaporated lanthanide oxide. Transistor 700 includes a silicon based substrate 710 with a source 720 and a drain 730 separated by a body region 732. Body region 732 between source 720 and drain 730 defines a channel region having a channel length 734. Located above body region 732 is a stack 755 including a gate dielectric 740, a floating gate 752, a floating gate dielectric 742, and a control gate 750. Gate dielectric 740 includes a dielectric containing a chemical vapor deposited hafnium oxide layer and an electron beam evaporated lanthanide oxide layer as described herein with the remaining elements of the transistor 700 formed using processes known to those skilled in the art. Alternately, both gate dielectric 740 and floating gate dielectric 742 may be formed as dielectric layers containing a chemical vapor deposited hafnium oxide and an electron beam evaporated lanthanide oxide in various embodiments as described herein. An interfacial layer 733 may form between body region 732 and gate dielectric 740. In an embodiment, interfacial layer 733 may be limited to a relatively small thickness compared to gate dielectric 740, or to a thickness significantly less than gate dielectric 740 as to be effectively eliminated.

Figure 8:
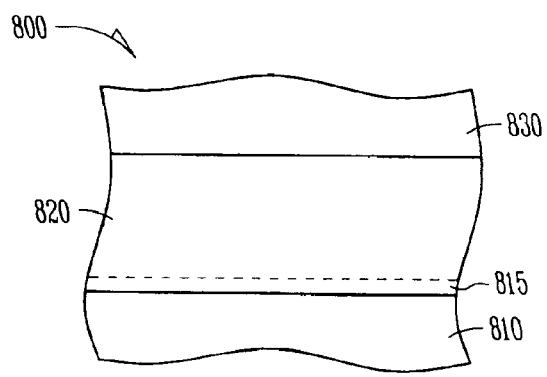
FIG. 8 shows an embodiment of a configuration of a capacitor having a dielectric layer containing a chemical vapor deposited hafnium oxide layer and an electronic beam evaporated lanthanide oxide layer, according to the present invention.

The embodiments of methods for forming dielectric layers containing a chemical vapor deposited hafnium oxide and an electron beam evaporated lanthanide oxide may also be applied to forming capacitors in various integrated circuits, memory devices, and electronic systems. In an embodiment for forming a capacitor 800 illustrated in FIG. 8, a method includes forming a first conductive layer 810, forming a dielectric layer 820 containing a chemical vapor deposited hafnium oxide and an electron beam evaporated lanthanide oxide on first conductive layer 810, and forming a second conductive layer 830 on dielectric layer 820. An interfacial layer 815 may form between first conductive layer 810 and dielectric layer 820. In an embodiment, interfacial layer 815 may be limited to a relatively small thickness compared to dielectric layer 820, or to a thickness significantly less than dielectric layer 820 as to be effectively eliminated.

Transistors, capacitors, and other devices dielectric layers containing a chemical vapor deposited hafnium oxide and an electron beam evaporated lanthanide oxide using methods described herein may be implemented into memory devices and electronic systems including information handling devices. Such information devices may include wireless systems, telecommunication systems, and computers. It will be recognized by one skilled in the art that several types of memory devices and electronic systems including information handling devices utilize embodiments of the present invention.

Figure 9:
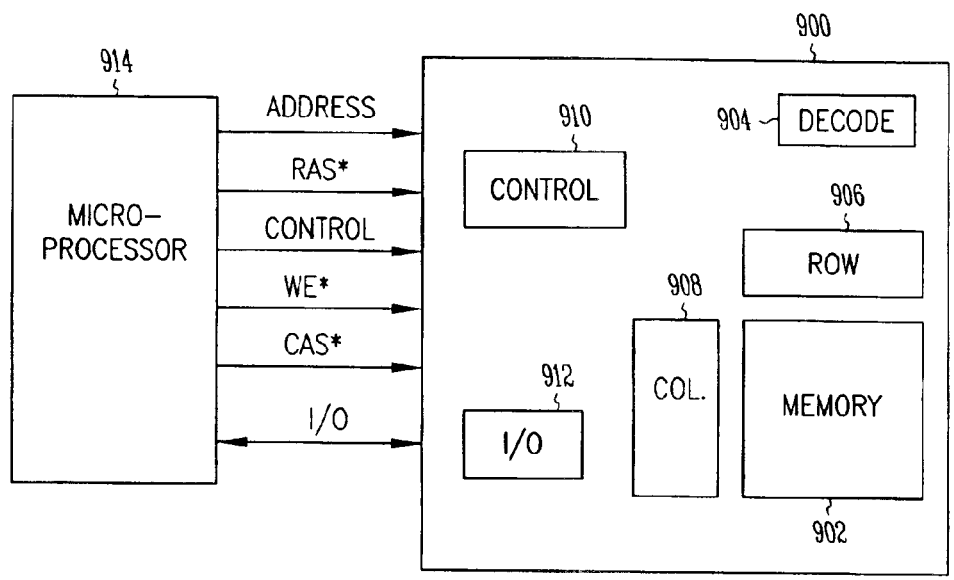
FIG. 9 is a simplified block diagram for an embodiment of a memory device with a dielectric layer containing a chemical vapor deposited hafnium oxide layer and an electronic beam evaporated lanthanide oxide layer, according to the present invention.

FIG. 9 is a simplified block diagram of a memory device 900 using an embodiment of a dielectric containing a chemical vapor deposited hafnium oxide and an electron beam evaporated lanthanide oxide. Memory device 900 includes an array of memory cells 902, address decoder 904, row access circuitry 906, column access circuitry 908, control circuitry 910, and Input/Output (I/O) circuit 912. The memory is operably coupled to an external microprocessor 914, or memory controller for memory accessing. Memory device 900 receives control signals from processor 914, such as WE*, RAS* and CAS* signals, which can be supplied on a system bus. Memory device 900 stores data that is accessed via I/O lines. Each memory cell in a row of memory cell array 902 is coupled to a common word line. The word line is coupled to gates of individual transistors, where at least one transistor has a gate coupled to a gate dielectric containing a chemical vapor deposited hafnium oxide and an electron beam evaporated lanthanide oxide in accordance with the methods and structure previously described herein. Additionally, each memory cell in a column is coupled to a common bit line. Each cell in memory array 902 may include a storage capacitor and an access transistor as is conventional in the art. It will be appreciated by those skilled in the art that additional circuitry and control signals can be provided, and that the memory device of FIG. 9 has been simplified to focus on embodiments of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 10:
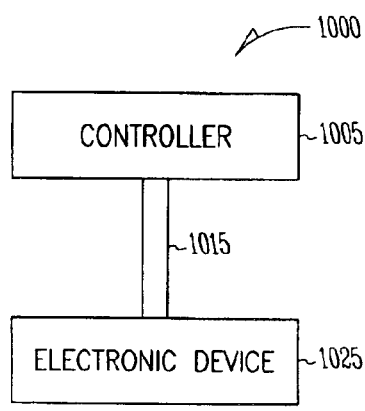
FIG. 10 illustrates a block diagram for an embodiment of an electronic system having devices with a dielectric layer containing a chemical vapor deposited hafnium oxide layer and an electronic beam evaporated lanthanide oxide layer, according to the present invention.

FIG. 10 illustrates a block diagram for an electronic system 1000 having devices with an embodiment for a dielectric layer containing a chemical vapor deposited hafnium oxide and an electron beam evaporated lanthanide oxide. Electronic system 1000 includes a controller 1005, a bus 1015, and an electronic device 1025, where bus 1015 provides electrical conductivity between controller 1005 and electronic device 1025. In various embodiments, controller 1005 and/or electronic device 1025 include an embodiment for a dielectric layer containing a chemical vapor deposited hafnium oxide and an electron beam evaporated lanthanide oxide as previously discussed herein. In an embodiment, electronic system 1000 includes a plurality of electronic devices using an embodiment for a dielectric layer containing a chemical vapor deposited hafnium oxide and an electron beam evaporated lanthanide oxide according to the present invention. Electronic system 1000 may include, but is not limited to, information handling devices, wireless systems, telecommunication systems, fiber optic systems, electro-optic systems, and computers.

CONCLUSION

A dielectric layer containing a chemical vapor deposited hafnium oxide and an electron beam evaporated lanthanide oxide, using methods described herein, provides a reliable dielectric layer having an equivalent oxide thickness thinner than attainable using $SiO_2$. The formation of these dielectric layers provides for enhanced dielectric and electrical properties relative to those attained with an amorphous $SiO_2$ layer. Additionally, forming hafnium oxide layers by chemical vapor deposition with precursors not containing carbon permits the formation of the hafnium oxide layers without unwanted contamination associated with carbon residue. These properties of dielectric layers containing a chemical vapor deposited hafnium oxide and an electron beam evaporated lanthanide oxide allow for application as dielectric layers in numerous devices and systems.

Capacitors, transistors, electro-optic devices, higher level ICs or devices, and electronic systems are constructed utilizing various embodiments for forming a dielectric layer containing a chemical vapor deposited hafnium oxide and an electron beam evaporated lanthanide oxide structured to provide an ultra thin equivalent oxide thickness, $t_{eq}$. Dielectric layers containing a chemical vapor deposited hafnium oxide and an electron beam evaporated lanthanide oxide are formed having a dielectric constant substantially higher than that of silicon dioxide, where such dielectric layers are capable of a $t_{eq}$ thinner than 10 Å, thinner than the expected limit for $SiO_2$ gate dielectrics. The thinner $t_{eq}$ of these dielectric layers allows for a higher capacitance than $SiO_2$ gate dielectrics, which provides further effective scaling for microelectronic devices and systems. At the same time, the physical thickness of the dielectric layer containing a chemical vapor deposited hafnium oxide and an electron beam evaporated lanthanide oxide is much larger than the $SiO_2$ thickness associated with the $t_{eq}$ limit of $SiO_2$. Forming the larger thickness aids in the manufacturing process for dielectric layers.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. A method of forming a dielectric layer comprising:
   forming a layer of hafnium oxide by chemical vapor deposition; and
   forming a layer of a lanthanide oxide by electron beam evaporation, wherein the layer of hafnium oxide is adjacent to and in contact with the layer of lanthanide oxide.

2. The method of claim 1, wherein the method further includes forming the layer of hafnium oxide on a substrate and forming the layer of lanthanide oxide on the layer of hafnium oxide.

3. The method of claim 1, wherein the method further includes forming the layer of lanthanide oxide on a substrate and forming the layer of hafnium oxide on the layer of lanthanide oxide.

4. The method of claim 1, wherein the method further includes controlling the forming of the layer of hafnium oxide and the forming of the layer of the lanthanide oxide to form a lanthanide oxide/hafnium oxide nanolaminate.

5. The method of claim 1, wherein the method further includes limiting a combined thickness of lanthanide oxide layers to a thickness ranging from about 2 nanometers to about 10 nanometers.

6. The method of claim 1, wherein the method further includes limiting a combined thickness of hafnium oxide layers to a thickness ranging from about 2 nanometers to about 10 nanometers.

7. The method of claim 1, wherein the method further includes forming one or more layers of lanthanide oxide, each layer of lanthanide oxide having a thickness ranging from about 2 nanometers to about 10 nanometers.

8. The method of claim 1, wherein forming a layer of a lanthanide oxide includes forming an oxide selected from $Pr_2O_3$, $Nd_2O_3$, $Sm_2O_3$, $Gd_2O_3$, and $Dy_2O_3$.

9. The method of claim 1, wherein the method further includes maintaining the substrate at a temperature ranging from about 100° C. to about 150° C. during electron beam deposition and maintaining the substrate at a temperature ranging from about 200° C. to about 400° C. during chemical vapor deposition.

10. The method of claim 1, wherein forming a layer of hafnium oxide by chemical vapor deposition includes forming a layer of hafnium oxide by chemical vapor deposition using precursors that do not contain carbon.

11. The method of claim 1, wherein the method further includes adding oxygen during the electron beam evaporation of the layer of lanthanide oxide.

12. A method of forming a dielectric layer comprising:
    forming a layer of hafnium oxide on a substrate by chemical vapor deposition using a $Hf(NO_3)_4$ precursor; and
    forming a layer of a lanthanide oxide on the layer of hafnium oxide by electron beam evaporation.

13. The method of claim 12, wherein the method further includes controlling the forming of the layer of hafnium oxide and the forming of the layer of the lanthanide oxide to form a lanthanide oxide/hafnium oxide nanolaminate.

14. The method of claim 12, wherein the method further includes limiting a combined thickness of lanthanide oxide layers to a thickness between about 2 nanometers and about 10 nanometers.

15. The method of claim 12, wherein forming a layer of a lanthanide oxide includes forming an oxide selected from $Pr_2O_3$, $Nd_2O_3$, $Sm_2O_3$, $Gd_2O_3$, and $Dy_2O_3$.

16. The method of claim 12, wherein the method further includes maintaining the substrate at a temperature ranging from about 100° C. to about 150° C. during electron beam deposition and maintaining the substrate at a temperature ranging from about 200° C. to about 400° C. during chemical vapor deposition.

17. A method of forming a capacitor, comprising:
    forming a first conductive layer on a substrate;
    forming a dielectric layer on the first conductive layer; and
    forming a second conductive layer on the dielectric layer, wherein forming the dielectric layer includes:
      forming a layer of hafnium oxide on the first conductive layer by chemical vapor deposition using a $Hf(NO_3)_4$ precursor; and
      forming a layer of a lanthanide oxide on the layer of hafnium oxide by electron beam evaporation, wherein the dielectric layer is formed with a combined thickness of lanthanide oxide layers limited to between about 2 nanometers and about 10 nanometers.

18. The method of claim 17, wherein the method further includes controlling the forming of the layer of hafnium oxide and the forming of the layer of the lanthanide oxide on the layer of hafnium to form a lanthanide oxide/hafnium oxide nanolaminate.

19. The method of claim 17, wherein forming a layer of a lanthanide oxide includes forming an oxide selected from $Pr_2O_3$, $Nd_2O_3$, $Sm_2O_3$, $Gd_2O_3$, and $Dy_2O_3$.

20. The method of claim 17, wherein the method further includes maintaining the substrate at a temperature ranging from about 100° C. to about 150° C. during electron beam deposition and maintaining the substrate at a temperature ranging from about 200° C. to about 400° C. during chemical vapor deposition.

21. A method of forming a transistor comprising:
    forming a source region and a drain region in a substrate, the source region and the drain region separated by a body region;

forming a dielectric layer on the body region, the dielectric layer containing a nanolaminate of hafnium oxide and a lanthanide oxide; and coupling a gate to the dielectric layer, wherein forming the nanolaminate includes:

forming a layer of hafnium oxide by chemical vapor deposition; and forming a layer of a lanthanide oxide by electron beam evaporation.

22. The method of claim 21, wherein the method further includes limiting a combined thickness of lanthanide oxide layers to a thickness between about 2 nanometers and about 10 nanometers.

23. The method of claim 21, wherein the method further includes forming one or more layers of lanthanide oxide, each layer limited to a thickness between about 2 nanometers and about 10 nanometers.

24. The method of claim 21, wherein forming a layer of a lanthanide oxide includes forming an oxide selected from $Pr_2O_3$, $Nd_2O_3$, $Sm_2O_3$, $Gd_2O_3$, and $Dy_2O_3$.

25. The method of claim 21, wherein forming a layer of a hafnium oxide by chemical vapor deposition includes using a hafnium nitrate precursor.

26. The method of claim 21, wherein forming a layer of hafnium oxide by chemical vapor deposition includes forming a layer of hafnium oxide by chemical vapor deposition using precursors that do not contain carbon.

27. The method of claim 21, wherein the method further includes maintaining the substrate at a temperature ranging from about 100° C. to about 150° C. during electron beam deposition and maintaining the substrate at a temperature ranging from about 200° C. to about 400° C. during chemical vapor deposition.

28. The method of claim 21, wherein the method further includes adding oxygen during the electron beam evaporation of the layer of lanthanide oxide.

29. A method of forming a memory comprising:

forming a number of access transistors including forming a dielectric layer on a body region in a substrate, the body region between a source region and a drain region; and forming a number of word lines, each word line coupled to one of the number of access transistors, wherein forming the dielectric layer includes:

forming a layer of hafnium oxide on the body region by chemical vapor deposition using precursors that do not contain carbon; and forming a layer of a lanthanide oxide on the layer of hafnium oxide by electron beam evaporation.

30. The method of claim 29, wherein the method further includes limiting a combined thickness of lanthanide oxide layers to between about 2 nanometers and about 10 nanometers and limiting a combined thickness of hafnium oxide layers to between about 2 nanometers and about 10 nanometers.

31. The method of claim 29, wherein the method further includes forming one or more layers of lanthanide oxide, each layer limited to a thickness between about 2 nanometers and about 10 nanometers.

32. The method of claim 29, wherein forming a layer of a lanthanide oxide includes forming an oxide selected from $Pr_2O_3$, $Nd_2O_3$, $Sm_2O_3$, $Gd_2O_3$, and $Dy_2O_3$.

33. The method of claim 29, wherein forming a layer of a hafnium oxide by chemical vapor deposition includes using a hafnium nitrate precursor.

34. The method of claim 29, wherein forming a dielectric layer includes forming two or more layers of lanthanide oxide with at least two layers having different lanthanide oxides selected from $Pr_2O_3$, $Nd_2O_3$, $Sm_2O_3$, $Gd_2O_3$, and $Dy_2O_3$.

35. The method of claim 29, wherein the method further includes maintaining the substrate at a temperature ranging from about 100° C. to about 150° C. during electron beam deposition and maintaining the substrate at a temperature ranging from about 200° C. to about 400° C. during chemical vapor deposition.

36. The method of claim 29, wherein the method further includes adding oxygen during the electron beam evaporation of the layer of lanthanide oxide.

37. A method of forming an electronic system comprising:

providing a controller; and coupling a device to the controller, wherein at least one of the controller and the device includes a dielectric layer having a nanolaminate of hafnium oxide and a lanthanide oxide, wherein forming the nanolaminate includes:

forming a layer of hafnium oxide by chemical vapor deposition; and forming a layer of a lanthanide oxide by electron beam evaporation.

38. The method of claim 37, wherein the method further includes limiting a combined thickness of lanthanide oxide layers to between about 2 nanometers and about 10 nanometers.

39. The method of claim 37, wherein the method further includes limiting a combined thickness of hafnium oxide layers to between about 2 nanometers and about 10 nanometers.

40. The method of claim 37, wherein the method further includes forming one or more layers of lanthanide oxide, each layer limited to a thickness between about 2 nanometers and about 10 nanometers.

41. The method of claim 37, wherein forming a layer of a lanthanide oxide includes forming an oxide selected from $Pr_2O_3$, $Nd_2O_3$, $Sm_2O_3$, $Gd_2O_3$, and $Dy_2O_3$.

42. The method of claim 37, wherein forming a layer of a hafnium oxide by chemical vapor deposition includes using a hafnium nitrate precursor.

43. The method of claim 37, wherein forming a layer of hafnium oxide by chemical vapor deposition includes forming a layer of hafnium oxide by chemical vapor deposition using precursors that do not contain carbon.

44. The method of claim 37, wherein the method further includes maintaining the substrate at a temperature ranging from about 100° C. to about 150° C. during electron beam deposition and maintaining the substrate at a temperature ranging from about 200° C. to about 400° C. during chemical vapor deposition.

45. The method of claim 37, wherein the method further includes adding oxygen during the electron beam evaporation of the layer of lanthanide oxide.

* * * * *

UNITED STATES PATENT AND TRADEMARK OFFICE
CERTIFICATE OF CORRECTION

PATENT NO. : 7,049,192 B2  Page 1 of 1
APPLICATION NO. : 10/602315
DATED : May 23, 2005
INVENTOR(S) : Ahn et al.

It is certified that error appears in the above-identified patent and that said Letters Patent is hereby corrected as shown below:

On page 2, in item (56), under "U.S. Patent Documents", in column 1, line 30, delete "Forbes et al." and insert - - Ahn et al. - -, therefor.

On page 2, in item (56), under "U.S. Patent Documents", in column 1, line 58, after "Katsir" insert - - et al. - -.

On page 3, in item (56), under "Other Publications", in column 1, lines 33-34, delete "lanthanum" and insert - - lanthanum - -, therefor.

On page 3, in item (56), under "Other Publications", in column 1, line 41, delete "Electroc" and insert - - Electron - -, therefor.

On page 3, item (56), under "Other Publications", in column 2, line 2, delete "HfO1/Hf" and insert - - $HfO_2/Hf$ - -, therefor.

On page 3, in item (56), under "Other Publications", in column 2, line 63, delete "system" and insert - - system - -, therefor.

On page 4, in item (56), under "Other Publications", in column 1, line 26, delete "Lanthanium" and insert - - Lanthanum - -, therefor.

In column 13, line 16, delete "Divest" and insert - - Digest - -, therefor.

In column 20, line 45, in Claim 41, delete "$Sm_2Q_3$" and insert - - $Sm_2O_3$ - -, therefor.

Signed and Sealed this

Fifteenth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 7,049,192 B2
APPLICATION NO. : 10/602315
DATED : May 23, 2006
INVENTOR(S) : Ahn et al.

It is certified that error appears in the above-identified patent and that said Letters Patent is hereby corrected as shown below:

On page 2, in item (56), under "U.S. Patent Documents", in column 1, line 30 delete "Forbes et al." and insert - - Ahn et al. - -, therefor.

On page 2, in item (56), under "U.S. Patent Documents", in column 1, line 58, after "Katsir" insert - - et al. - -.

On page 3, in item (56), under "Other Publications", in column 1, lines 33-34, delete "lanthanum" and insert - - lanthanum - -, therefor.

On page 3, in item (56), under "Other Publications", in column 1, line 41, delete "Electroc" and insert - - Electron - -, therefor.

On page 3, item (56), under "Other Publications", in column 2, line 2, delete "HfO1/Hf" and insert - - $HfO_2/Hf$ - -, therefor.

On page 3, in item (56), under "Other Publications", in column 2, line 63, delete "system" and insert - - system - -, therefor.

On page 4, in item (56), under "Other Publications", in column 1, line 26, delete "Lanthanium" and insert - - Lanthanum - -, therefor.

In column 13, line 16, delete "Divest" and insert - - Digest - -, therefor.

UNITED STATES PATENT AND TRADEMARK OFFICE
CERTIFICATE OF CORRECTION

PATENT NO. : 7,049,192 B2
APPLICATION NO. : 10/602315
DATED : May 23, 2006
INVENTOR(S) : Ahn et al.

It is certified that error appears in the above-identified patent and that said Letters Patent is hereby corrected as shown below:

In column 20, line 45, in Claim 41, delete "$Sm_2Q_3$" and insert - - $Sm_2O_3$ - -, therefor.

This certificate supersedes certificate of correction issued August 15, 2006.

Signed and Sealed this

Nineteenth Day of September, 2006

JON W. DUDAS
*Director of the United States Patent and Trademark Office*